(12) United States Patent
Wetsel

(10) Patent No.: US 7,352,506 B2
(45) Date of Patent: Apr. 1, 2008

(54) METHOD AND SYSTEM FOR SENSING ENVIRONMENTAL CHARACTERISTICS

(76) Inventor: Grover C. Wetsel, 1757 SW. Prospect Dr., Portland, OR (US) 97201

( * ) Notice: Subject to any disclaimer, the term of this patent is extended or adjusted under 35 U.S.C. 154(b) by 0 days.

(21) Appl. No.: 11/349,003

(22) Filed: Feb. 7, 2006

(65) Prior Publication Data

US 2006/0232849 A1 Oct. 19, 2006

Related U.S. Application Data

(60) Provisional application No. 60/650,600, filed on Feb. 7, 2005.

(51) Int. Cl.
*H01S 3/00* (2006.01)
(52) U.S. Cl. ............... 359/333; 359/330; 359/331; 359/332; 250/227.11; 250/227.12; 250/227.13; 250/227.14; 250/234; 330/4.6

(58) Field of Classification Search ........... 250/234, 250/227.11–14; 324/529; 330/4.6; 73/655, 73/627, 649; 359/330–332
See application file for complete search history.

(56) References Cited

U.S. PATENT DOCUMENTS 3,290,610 A * 12/1966 Auld et al. ........... 330/4.6
6,835,926 B2 * 12/2004 Weitekamp et al. ...... 250/234

* cited by examiner

*Primary Examiner*—Brian Healy
*Assistant Examiner*—Guy G Anderson
(74) *Attorney, Agent, or Firm*—Alan G. Towner, Esq.; Pietragallo Gordon Alfano Bosick & Raspanti, LLP

(57) ABSTRACT

A system for sensing characteristics of the environment is disclosed. Sensors utilize exponential growth of a signal initiated by interaction of a sensor element with characteristics of the environment. Specific substances in the environment can be detected. The sensor element may be intrinsically sensitive to the specific substance or can be coated with a material that is sensitive to the specific substance. The sensor component is designed such that it can be made to cause exponential growth of a system signal. The exponential growth of the sensor signal is produced by parametric amplification.

17 Claims, 13 Drawing Sheets

METHOD AND SYSTEM FOR SENSING ENVIRONMENTAL CHARACTERISTICS

CROSS-REFERENCE TO RELATED APPLICATION

This application claims the benefit of U.S. Provisional Patent Application Ser. No. 60/650,600 filed Feb. 7, 2005, which is incorporated herein by reference.

FIELD OF THE INVENTION

The present invention relates to environmental sensors, and more particularly relates to sensors which utilize exponential growth of a signal initiated by interaction of a sensor element with characteristics of the environment.

BACKGROUND INFORMATION

Environmental sensors are used to detect various materials including chemical and biological agents. However, a need exists for improved sensors which can detect specific types of compounds and which can detect trace amounts of compounds.

SUMMARY OF THE INVENTION

This invention provides an environmental sensor system which is affected by environmental characteristics such as substances in the environment, the presence of electromagnetic radiation, and the like. The system includes a sensor element that is intrinsically sensitive or can be coated with a material that is sensitive to the specific environmental characteristic. The sensor may cause exponential growth of a system signal by parametric amplification. The quiescent operating point of the sensor is designed to be proximate to the threshold of onset or quenching of exponential growth.

The present invention represents an improvement over prior environmental sensors by utilizing exponential growth of a signal initiated by interaction of a sensor element with specific characteristics of the environment. The sensor system can have numerous embodiments, such as mechanical, electrical, magnetic or optical, as appropriate to the characteristic to be detected. Common features of these embodiments are the exponential growth of a sensor signal due to parametric amplification, and design of the quiescent operating point proximate to the threshold of onset or quenching of exponential growth.

In a physical system, one may distinguish dynamical variables, which usually change with changes in time, from material parameters, which usually are constant with changes in time. However, in any physical system, material parameters are constant only for sufficiently-small amplitudes of dynamical variation and for sufficiently-small changes in environmental parameters, such as temperature, external forces, incident radiation, or reaction with contiguous matter. When the amplitude of dynamical variation or the changes in environmental parameters are not sufficiently small, then the material parameters can have values which differ from those for small-amplitude dynamical variation. The parameters are then said to be nonlinear. A parametric amplifier is an amplifier utilizing a nonlinear material parameter or one that can be varied as a function of time by applying a suitable external influence known as a "pump". An example is an electrical circuit consisting of a voltage generator, a resistor, a capacitor, and an inductor. The voltage and current in the circuit are dynamical variables; the resistance, capacitance, and inductance are parameters. If the capacitance is varied, for example, by mechanically varying the spacing of the capacitor electrodes (the "pump"), then parametric amplification of the voltage across the capacitor (the "signal") can be produced.

The characteristic behavior of parametric amplification is the exponential growth of the amplitude of the signal when the amplitude of the pump exceeds some critical value. The exponential growth does not continue indefinitely, but eventually reaches saturation due to limitations of one or more components of the system. The gain factor, k, characterizing the growth of the signal is a function of material and dynamical quantities. When certain conditions are satisfied and the amplitude of the pump is such that k exceeds its critical value, then exponential growth of the signal is initiated. Features of this invention are the exponential growth of the signal during the time interval between threshold and saturation, and the dependence of the growth factor, k, on environmentally-sensitive quantities. Various embodiments of the parametric-amplifier system can be constructed according to these principles.

An aspect of the present invention is to provide a parametric amplification system comprising a dither transducer, a pump transducer, and an elastic rod connected between the dither and pump transducers.

Another aspect of the present invention is to provide an environmental sensor including a parametric amplifier which exhibits exponential temporal growth when exposed to an environmental characteristic.

A further aspect of the present invention is to provide a method of detecting an environmental characteristic. The method comprises exposing a sensor to an environment, and monitoring exponential temporal growth of a signal generated by the sensor upon exposure to the environmental characteristic.

These and other aspects of the present invention will be more apparent from the following description.

DETAILED DESCRIPTION

Figure 1:
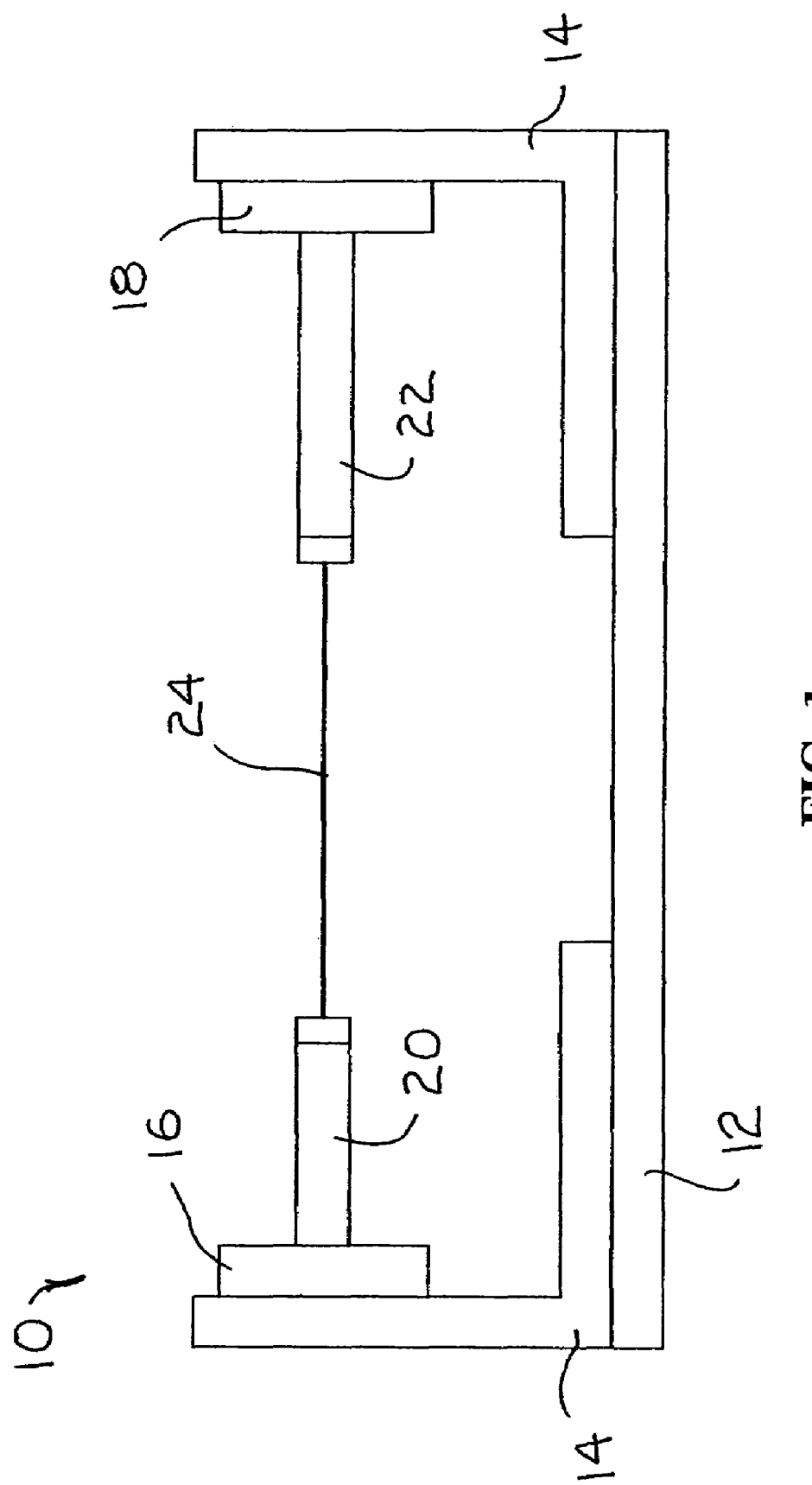
FIG. 1 is a schematic diagram of a system used to produce parametric amplification in an elastic rod in accordance with an embodiment of the present invention.

An embodiment of the invention provides an environmental sensor which utilizes parametric amplification of bending motion in an elastic rod. An example of such an assembly 10 is illustrated in FIG. 1. The ends of an elastic rod 24 made of a material such as fused quartz, Teflon or Nitinol are attached to electro-mechanical transducers in the form of a dither transducer 20 and a pump transducer 22. The size of the elastic rod 24 may be selected based upon the desired frequency of operation, for example, having a diameter of from less than 1 to greater than 10 or 100 mm, and a length of from less than 10 to greater than 100 mm. The dither transducer 20 may be a piezoelectric tube configured to bend perpendicular to its axis upon the application of voltage to its electrodes. The piezoelectric material of the dither transducer 20 may comprise lead-zirconium-titanate or any other suitable material, and the size of the tube may be selected based upon the desired frequency of operation, for example, having a diameter of from 1 or 2 to greater than 10 or 100 mm, and a length of from less than 10 to greater than 100 mm. The pump transducer 22 may be a piezoelectric tube configured to extend parallel to its axis upon the application of voltage to its electrodes. The piezoelectric material of the pump transducer 22 may comprise lead-zirconium-titanate or any other suitable material, and the size of the tube may be selected based upon the desired frequency of operation, for example, having a diameter of from 1 or 2 to greater than 10 or 100 mm, and a length of from less than 10 to greater than 100 mm. The transducers 20 and 22 are affixed to mounting plates 16 and 18, respectively, which are in turn affixed to brackets 14. The assembly is affixed to a base plate 12.

Figure 2:
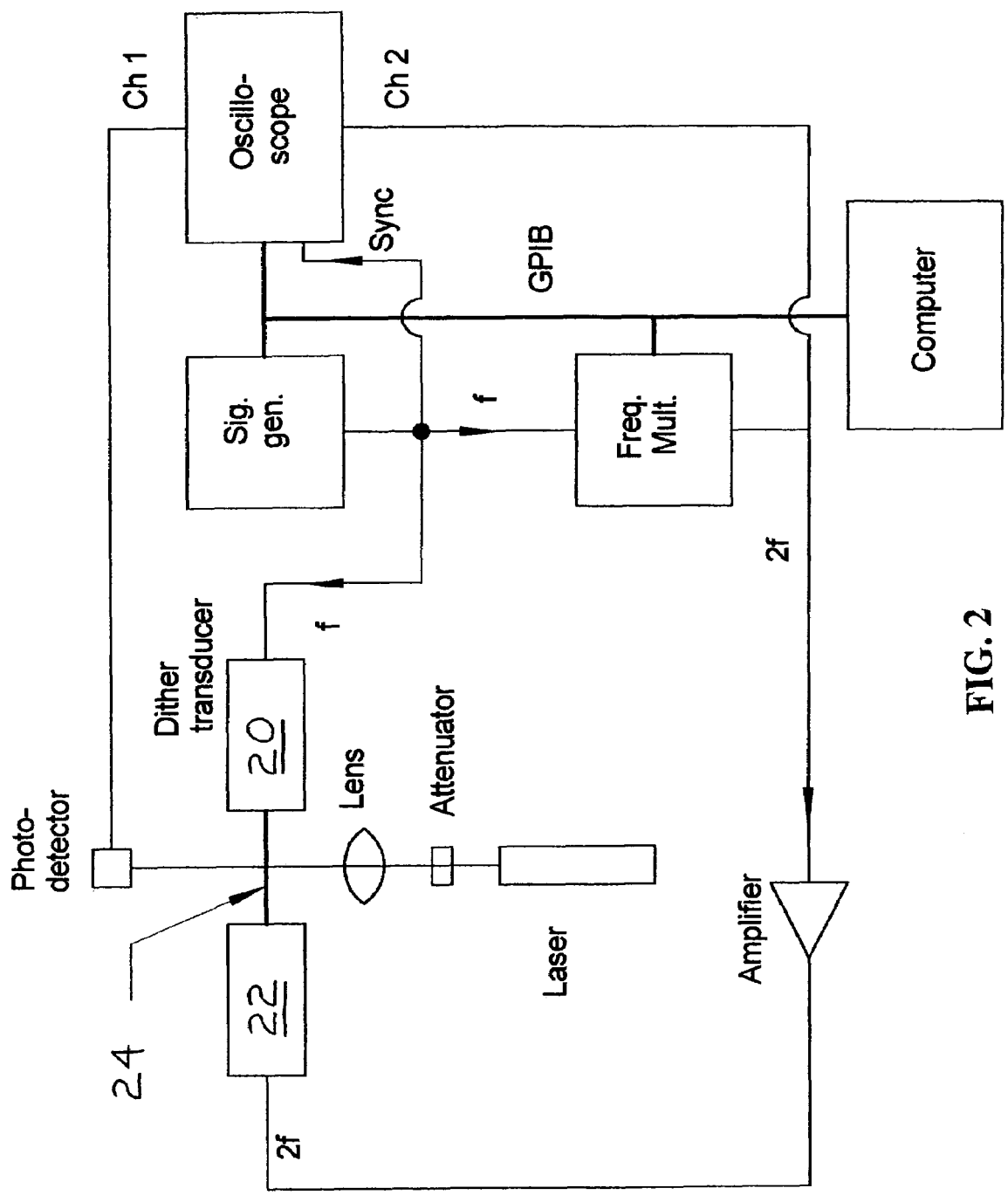
FIG. 2 is a block diagram of an apparatus for exciting and measuring parametric amplification in an elastic rod in accordance with an embodiment of the present invention.

The electrical components for exciting the transducers and the instrumentation for measuring the bending motion are illustrated in FIG. 2. An AC voltage with frequency, f, from a signal generator is connected to the dither transducer 20. The output of the signal generator is also connected to a frequency multiplier. The output of the frequency multiplier with frequency, 2f, is connected to a voltage amplifier. The amplified voltage is connected to the pump transducer 22.

In operation, the frequency, f, of the generator signal is adjusted to correspond to a bending resonance (its fundamental resonance, for example) of the elastic rod 24. The amplitude is set at a convenient value. The amplitude of the longitudinal vibration (2f) of the pump transducer 22 is then increased from zero up to the critical value required for parametric amplification of the bending motion of the elastic rod 24 at frequency, f. When the pump amplitude is above the threshold value, the bending motion increases exponentially with time until the motion saturates.

The parametric amplification of the bending signal can be measured using the detection apparatus also shown in FIG. 2. The signal generator, frequency multiplier, and oscilloscope are controlled via a general-purpose interface bus (GPIB) by the computer. With the frequency of the signal generator tuned to a bending resonance of the rod, the frequency-multiplier is gated on, and the displacement from equilibrium is recorded as a function of time using the waveform-digitizing oscilloscope. A beam from a laser is focused on the rod 24 and a photodetector detects the light scattered by the rod 24. The effect of the motion of the rod 24 in the focal plane of the laser beam on the photodetector signal can be calibrated. The bending motion of the rod 24 can then be measured using a method known as optical-beam-deflection (OBD) sensing.

Figure 3:
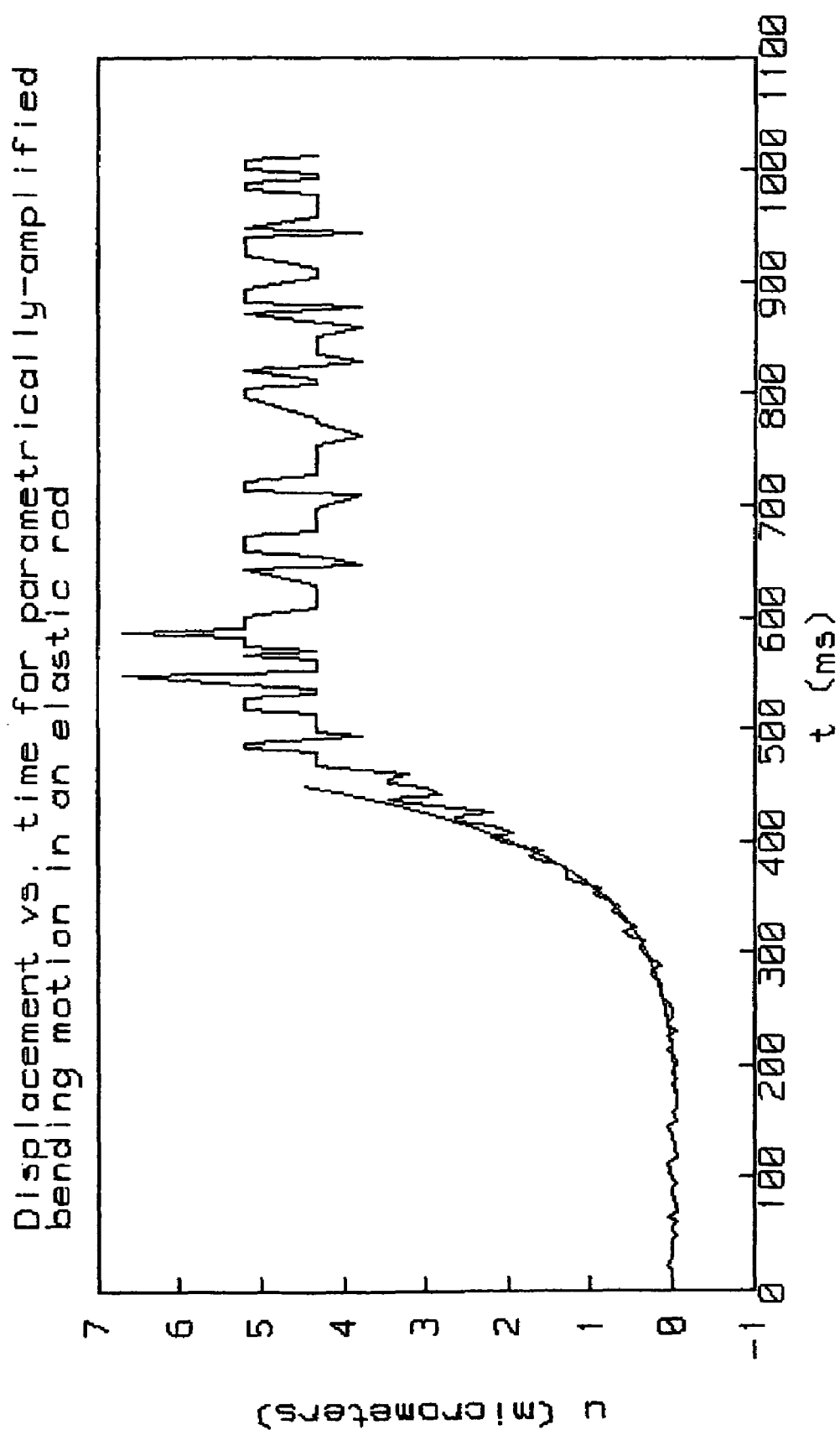
FIG. 3 is a graph of measured displacement at frequency $1f$ as a function of time for bending motion in an elastic rod with the pump voltage at a frequency of $2f$ turned on at t=50 ms.

An example of the temporal development of the bending motion of the rod is shown in FIG. 3. The pump voltage at a frequency twice that of the signal frequency was turned on at about t=150 ms. Also shown is a fit of an exponential function to the data. A good fit with a time constant of 62 ms is obtained until saturation begins.

A theoretical model of parametric amplification in elastic rods was developed so that environmental sensors could be quantitatively designed. The model is an elastic rod with (Young's) modulus of elasticity, E, density, ρ, radius, R, and length, L. The equation of motion of a rod in bending with losses (G. C. Wetsel, Jr. and M. A. Drummond Roby, "Dynamic Nanoscale Lateral-Force Determination", *Appl. Phys. Lett.* 67, 2735-2737 (1995)) is $$\frac{\partial^2 u}{\partial t^2} + \frac{E}{\rho} K_0^2 \frac{\partial^4}{\partial z^4}\left[u + \alpha \frac{\partial u}{\partial t}\right] = 0 \quad (1)$$

where u is the transverse displacement from equilibrium of a point, z, on the rod at time, t, $K_0$ is the radius of gyration ($K_0$=R/2 for a cylindrical rod of radius, R), and α is the parameter representing energy lost (the attenuation factor) from the vibration. For purposes of describing the results of the parametric amplification experiment, it was assumed that Eq. (1) is valid with the modification that Young's modulus is a function of time of the form, $$E(t)=E_0(1+\alpha \sin \omega_p t) \quad (2)$$

where a=δ$E_0$/$E_0$. The variables can be separated with the assumption, u(z,t)=U(z)G(t), to obtain a linear, fourth-order differential equation for U(z), $$\frac{d^4 U}{dz^4} = K^4 U, \quad (3)$$

where $K^4$=($\omega^2$ρ)/($E_0 K_0^2$) and a nonlinear second-order differential equation for G(t), $$\frac{d^2 G}{dt^2} = -\omega^2(1+a\sin\omega_p t)\left(\alpha\frac{dG}{dt}+G\right) \quad (4)$$

where $\omega^2$ is the separation constant. The solution of Eq. (3) is well-known (e.g., G. C. Wetsel, Jr. and M. A. Drummond Roby, "Dynamic Nanoscale Lateral-Force Determination", *Appl. Phys. Lett.* 67, 2735-2737 (1995)). The specific nature of the solution to Eq. (3) depends on the boundary conditions; the boundary conditions appropriate to this problem are that the rod is clamped at z=0 and z=L. For this case, the normal-mode resonant frequencies are given by $$f(n) = \frac{v_L K_0 \beta^2(n)}{2\pi L^2} \quad (5)$$

where $v_L=(E/\rho)^{1/2}$, and $\beta(n)$ depends on the specific normal mode. For the fundamental mode of vibration, $\beta(1)=4.73004074486$. As an example, for a rod 0.1395 mm in radius and 20.75 mm long fabricated from Nitinol, the fundamental resonant frequency is 1724 Hz.

Solution of the temporal equation yields parametric amplification. An approximate, analytical solution to Eq. (4) of the form, $$G(t)=g(t)e^{j(\omega t+\phi)}+c.c. \quad (6)$$

reveals that $g=g_0 \exp(kt)$, $\omega=\omega_p/2$, and $\phi=0, 2\pi, \ldots$ so that $$G(t)=g_0 e^{kt} e^{j\omega_p t/2}+c.c.=e^{kt}\cos(\omega_p t/2) \quad (7)$$

where the amplitude of u is subsumed in U(z), and $$k = \omega \left[\frac{a-2\alpha\omega}{4-a\alpha\omega}\right] \quad (8)$$

There is exponential growth if k>0, which occurs if $2\alpha\omega<a<4/(\alpha\omega)$. For example, if f=1700 Hz $\alpha=5\times10^{-7}$ s, then $1.068\times10^{-2}<a<749$.

Figure 4:
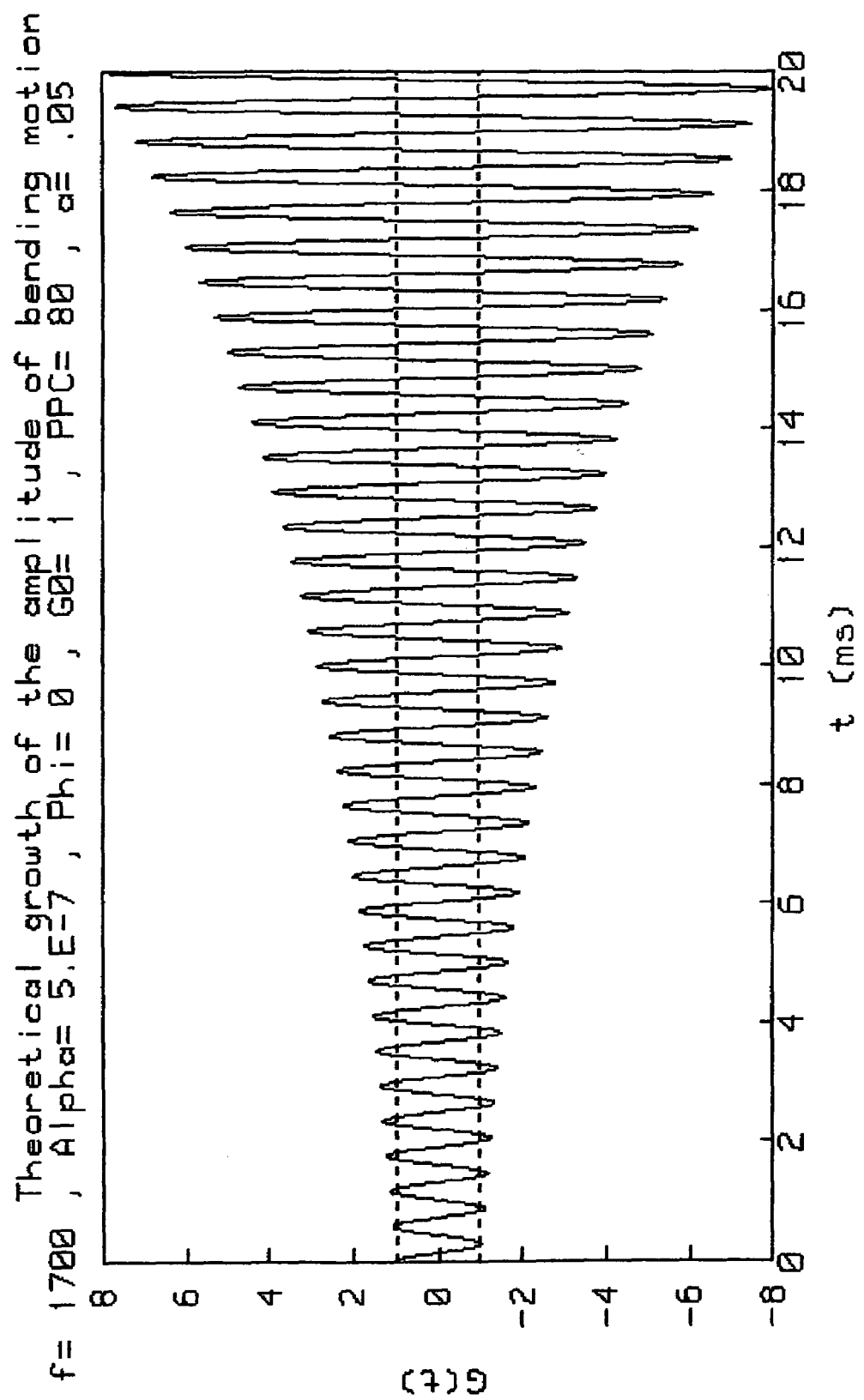
FIG. 4 shows growth of amplitude, G(t), of a bending motion at f=1.7 kHz as computed from a numerical solution of Eq. (4).

Equation (4) was also numerically integrated using a computer. The essential features of the analytical solution were verified. An example of the exponential growth of G(t) is shown in FIG. 4. Calculations based on the theoretical model are in good agreement with the experimental results.

Design of an environmental sensor utilizing parametric amplification of a rod in bending is based on Eq. (8). The exponential-growth factor, k, is an explicit function of dynamic and material parameters: $k=k(\omega, a, \alpha)$. Since the device is operated at a bending resonant frequency, k is also an implicit function of the material parameters, $\rho$, $E_0$, R, and L. When the pump is off (a=0), then the bending motion decays to zero from an initial value at a rate determined by the value of $\alpha$. When the pump is turned on at a frequency equal to twice the resonant frequency of the bending mode, then the strength of the pump, a, competes with the energy-loss factor, $\alpha$, to determine whether exponential decay or exponential growth occurs. For fixed $\alpha$ and variable a, then the critical value of pump strength, $a_c=2\alpha\omega=4\pi\alpha f$, must be exceeded in order for parametric amplification to occur. For fixed a and variable $\alpha$, then extant parametric amplification will be quenched when the attenuation factor exceeds the critical value, $\alpha_c=a/(4\pi f)$. Whereas the energy-loss parameter, $\alpha$, is of direct and obvious importance in this embodiment, the other material parameters can also play an important role.

Practical applications of environmental sensing include the detection of environmental characteristics, such as toxins, which might make sudden appearances in trace amounts. Therefore, an important feature of environmental sensors is sensitivity. One measure of sensitivity to changes in $\alpha$ in this embodiment is the time, $t_2$, required for the amplitude of bending motion to double. The doubling time is related to gain by $t_2=\ln(2)/k$. For example, if f=1700 Hz, $\alpha=6.336\times10^{-7}$ s, and a=0.0137, then k=0.4393 s$^{-1}$ and $t_2=1.578$ s; if f=1700 Hz $\alpha=6.4\times10^{-7}$ s, and a=0.0137, then k=0.0742 s$^{-1}$ and $t_2=9.34$ s. That is, a 1% change in $\alpha$ results in a 492% change in $t_2$ in this example.

Figure 5:
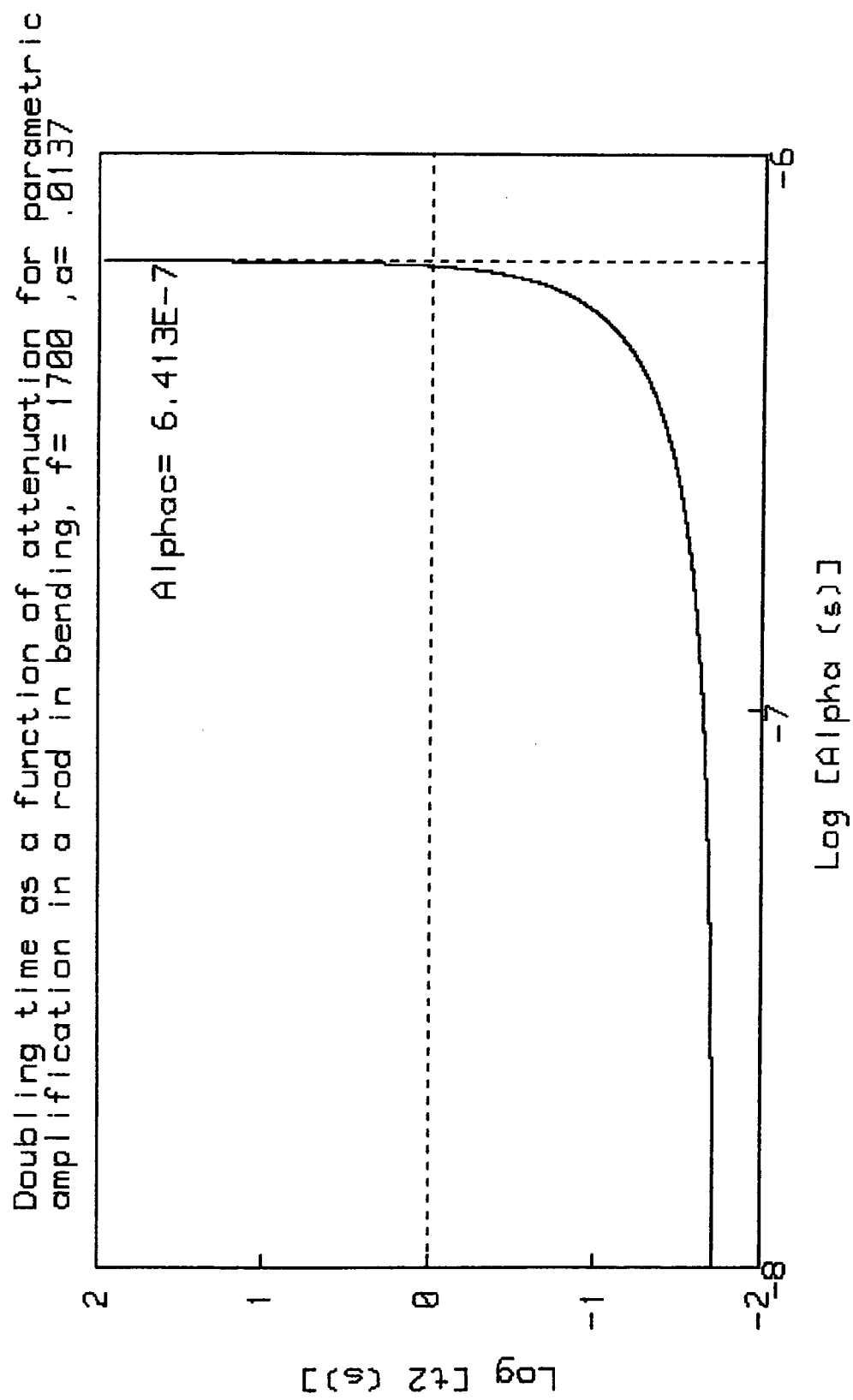
FIG. 5 shows variation of doubling time with attenuation near the critical point for parametric amplification in a rod vibrating in bending.

FIG. 5 shows a plot of $\log(t_2)$ vs. $\log(\alpha)$; $t_2$ is essentially equal to $4 \ln 2/(\alpha\omega)$ for small values of $\alpha$, but increases rapidly with $\alpha$ as $\alpha\rightarrow\alpha_c$. The quiescent operating point of the sensor should be near the critical point; then the sensor will be optimally-responsive to environmental changes. Changes in other material parameters could be utilized in a similar manner as dictated by the environmental characteristic to be sensed.

One method of utilizing the sensitivity of bending motion of the rod to its environment is to make use of effects induced by electromagnetic radiation. In many substances, incident electromagnetic radiation is absorbed and rapidly converted into heat. This photothermal conversion produces thermal changes in material parameters and also induces motion in the material via thermoacoustic coupling (e.g., F. A. McDonald and G. C. Wetsel, Jr., "Theory of Photoacoustic and Photothermal Effects in Condensed Matter", pp. 167-277, *Physical Acoustics*, Vol. 18, W. P. Mason and R. N. Thurston, Eds., Academic Press, San Diego, Calif. (1988)). The intrinsic rod material or a coating applied to the rod could be chosen to be particularly susceptible to radiation of a particular wavelength and an affinity for a particular substance in the environment (e.g., biotoxins). Then, when interactions of that material with environmental substances shift the absorption wavelengths, photothermal conversion would be modified and hence its affect on the environmental sensor would be modified.

Figure 6:
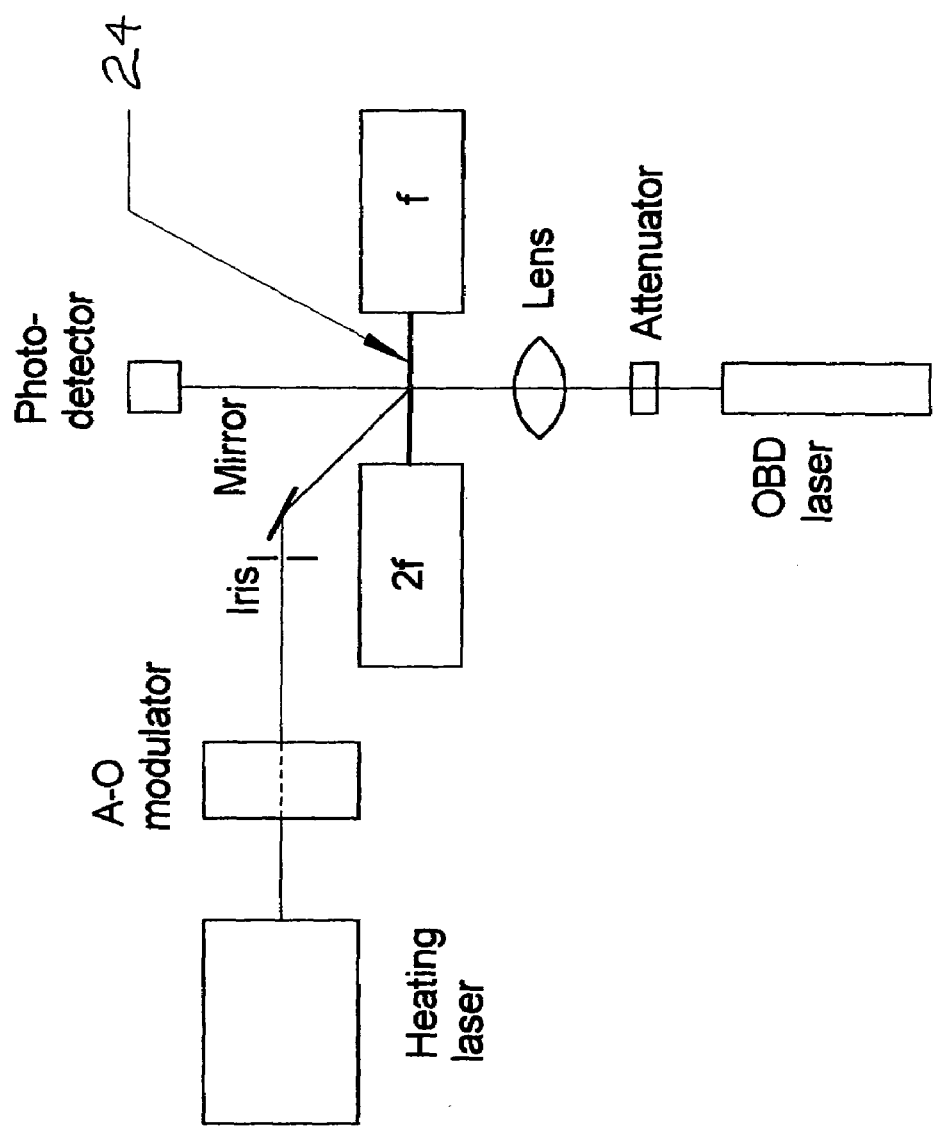
FIG. 6 is a block diagram of apparatus for laser switching of parametric amplification in a rod in accordance with an embodiment of the present invention.
Figure 7:
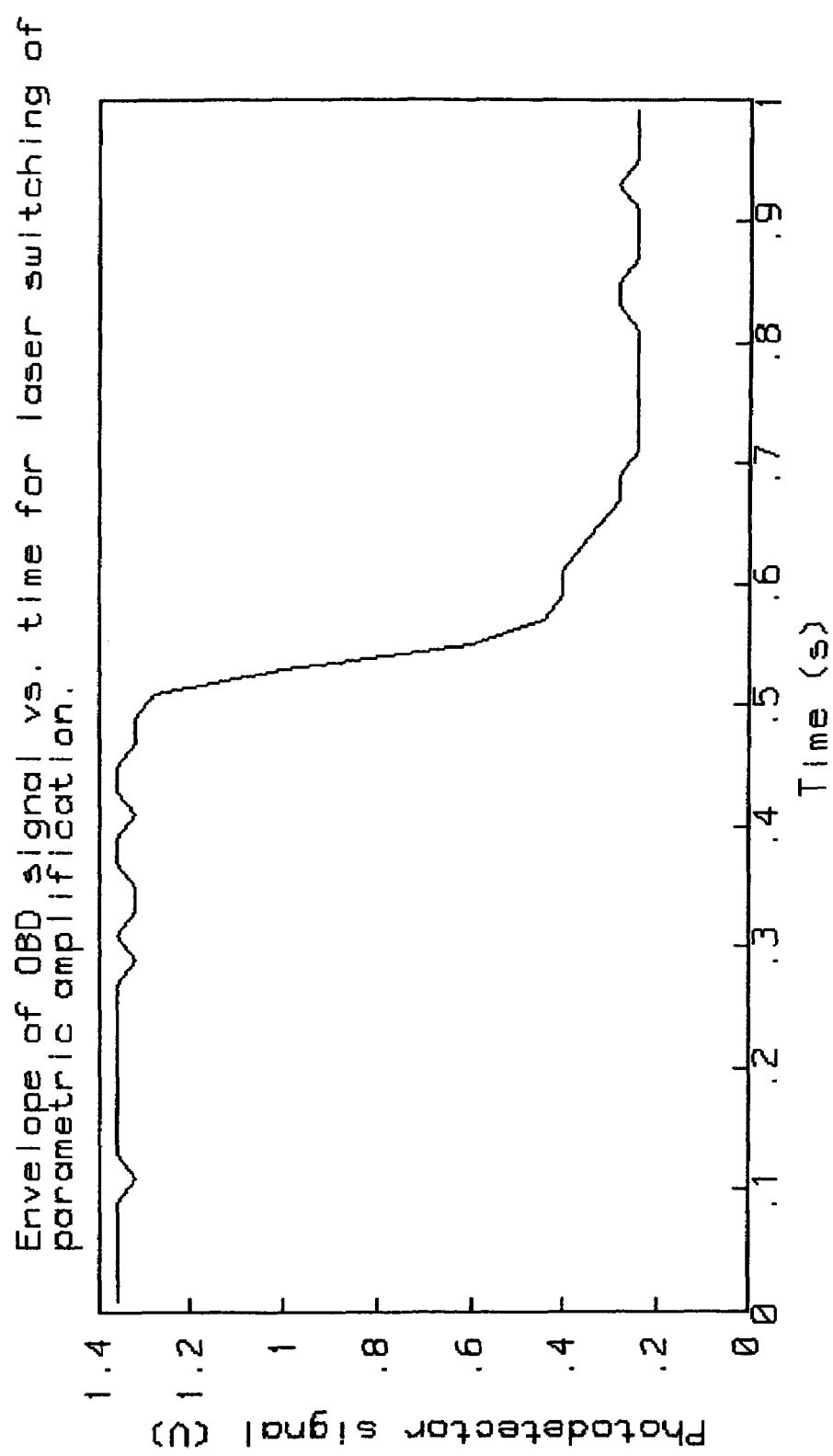
FIG. 7 is a graph of photodetector voltage vs. time showing laser quenching of parametric amplification in a rod vibrating in bending.

An example of the interaction of a parametric-amplification device with its environment is the toggling of the amplification off and on using photothermal heating by a laser. A system of controlled deflection of the laser beam to quench parametric amplification in the present embodiment is shown in FIG. 6. The light from the OBD laser is scattered by the rod 24 and detected by the photodetector. The rod 24 is driven at a bending resonance with frequency, f, by the dither transducer 20. The rod's modulus of elasticity is varied at 2f by the pump transducer 22. Light from a heating laser passes through an acousto-optic (AO) modulator and iris and is reflected by a mirror toward the rod 24. Parametric amplification is established by increasing the pump signal until the OBD (1f) signal is saturated. When the AO modulator is gated, the beam from the heating laser illuminates the rod 24. The parametric amplification is then quenched. FIG. 7 shows the envelope of the OBD signal as captured on a waveform-digitizing oscilloscope. The parametric amplification can be repeatedly switched off and on by deflecting the heating laser beam on and off the rod.

Figure 8:
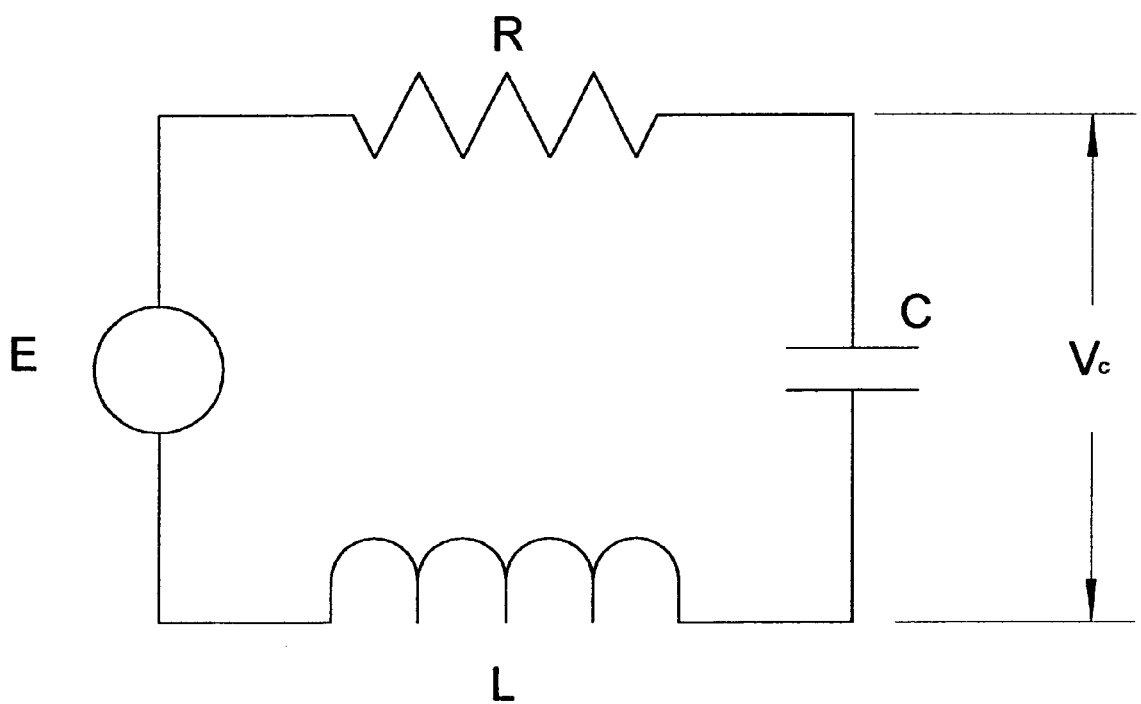
FIG. 8 is a schematic diagram for a generator with EMF, E, connected in series with resistance, R, capacitance, C, and inductance, L.

In addition to the embodiment described above, alternate embodiments that incorporate exponential growth due to parametric amplification and sensitivity to environmental characteristics may be used. One such embodiment is an electrical network such as that shown in FIG. 8. A resistor with resistance, R, a capacitor with capacitance, C, and an inductor with inductance, L, are connected in series with an AC generator with EMF, E, and frequency, f, tuned to the resonant frequency, $f_0$, of the circuit. If the capacitance is varied, e.g., by varying the spacing, d, of the electrodes with an electromechanical transducer, $$d(t)=d_0(1+\alpha \sin \omega_p t) \quad (9)$$

then an analysis similar to the one above shows that the voltage, $v_c$, across the capacitor varies exponentially with time when $\omega=\omega_p/2$, and $\phi=0,2,\pi,\ldots$ The exponential factor is $$k = \frac{\omega_0^2 a}{2\omega_p} - \frac{\alpha}{2}, \alpha = R/L. \tag{10}$$

If k>0, there is exponential gain; k=0 corresponds to constant amplitude. The critical value of a for exponential gain is $$\alpha_c = RC_0\omega_p. \tag{11}$$

Figure 9:
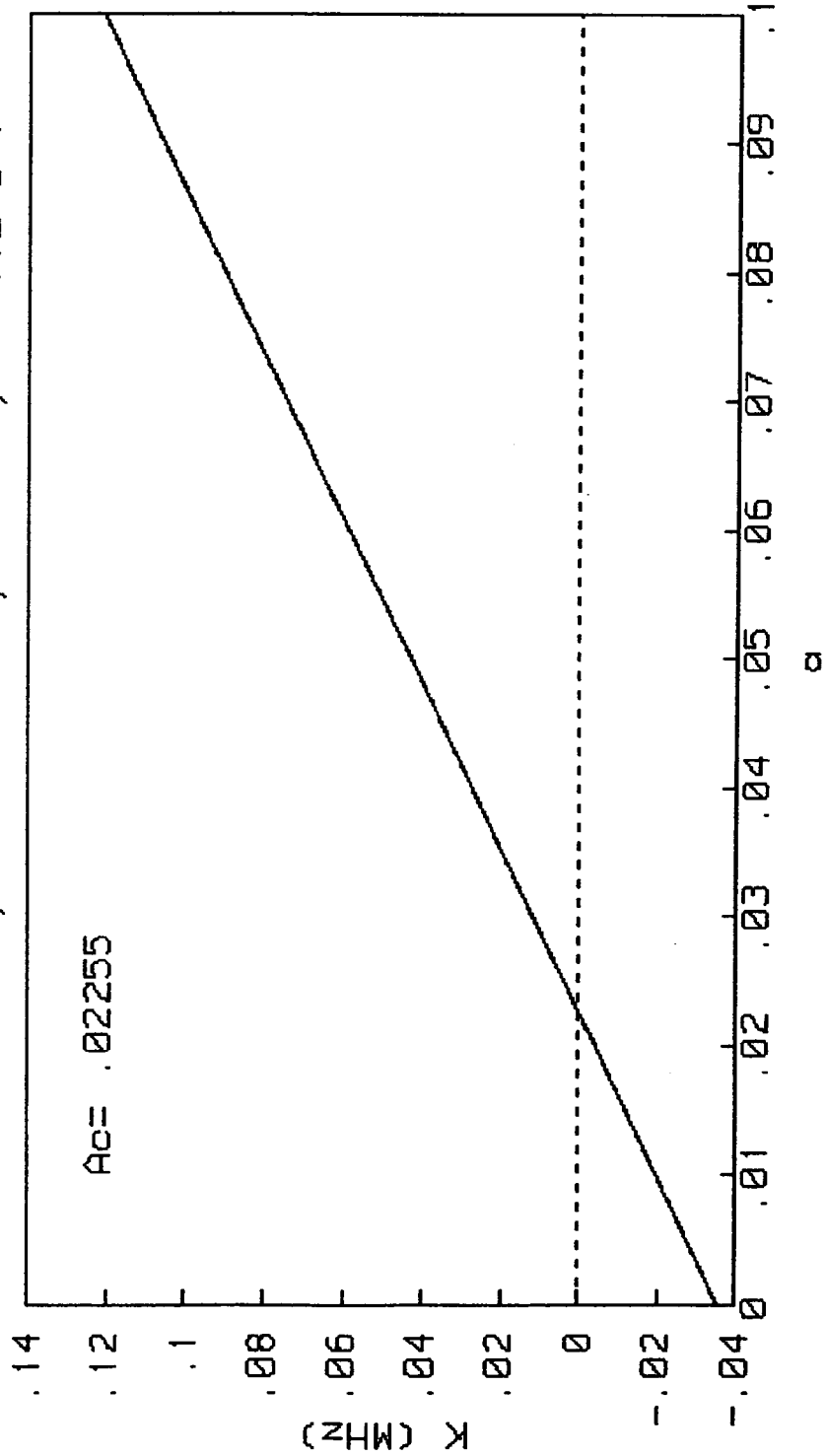
FIG. 9 shows parametric amplifier gain, k, as a function of pump amplitude, a, for a series RLC circuit with variable capacitance.
Figure 10:
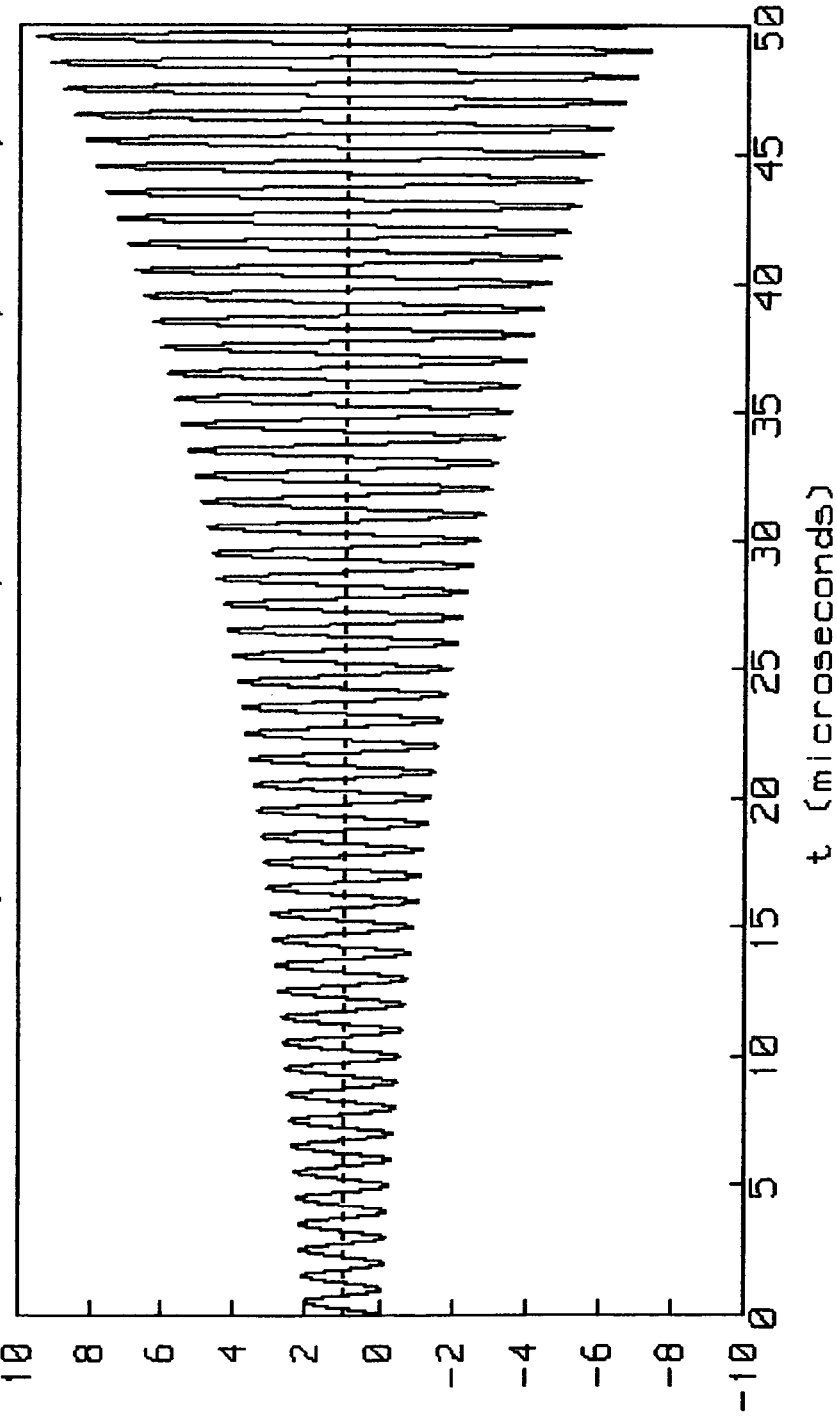
FIG. 10 shows voltage across a capacitor as a function of time for parametric amplification due to variable capacitance for E=1 V, a=0.05, $C_0$=35.9 pF, L=706 µH, $f_0$=1 MHz, and R=50Ω.

FIG. 9 shows k vs. a for representative values of the parameters. If $f_p/2=f_0=1$ MHz, then $a_c=0.02255$. The circuit equation was solved numerically and $v_c(t)$ was computed. A plot is shown in FIG. 10 for typical values of the parameters. For operation on resonance $\omega=\omega_0=1/(L/C_0)^{1/2}$, and $$k = \frac{a}{4\sqrt{LC_0}} - \frac{R}{2L}, \tag{12}$$

where $C_0$ is a function of the dielectric permittivity, $\in$.

Design of an environmental sensor utilizing parametric amplification due to a variable capacitance in an RLC circuit may be based on Eq. (12). When the pump is off (a=0), then $v_c$ decays to zero from an initial value at a rate determined by the value of R/(2L). When the pump is turned on at a frequency equal to twice the resonant frequency of the circuit, then the strength of the pump, a, competes with energy-loss to determine whether exponential decay or exponential growth occurs as in the previous embodiment. One method of designing a sensor in this embodiment is to make use of the sensitivity of the dielectric permittivity, $\in$, to changes in environmental characteristics. The dielectric could be fabricated from a material designed to be particularly sensitive to the environmental characteristic of interest. For example, the dielectric material could be a polymer, such as FEP, that has been infused with or coated with a substance appropriate to the design requirements of the sensor. Polymer dielectrics infused with a specific metal are particularly useful for this purpose. The gain factor, k, is also a function of circuit resistance. It is recognized that since dielectrics have energy losses in time-varying electric fields, environmental effects on the losses—the parallel resistance in an equivalent circuit for a lossy capacitor—can also be effectively utilized in parametric-amplifier based sensors.

Figure 11:
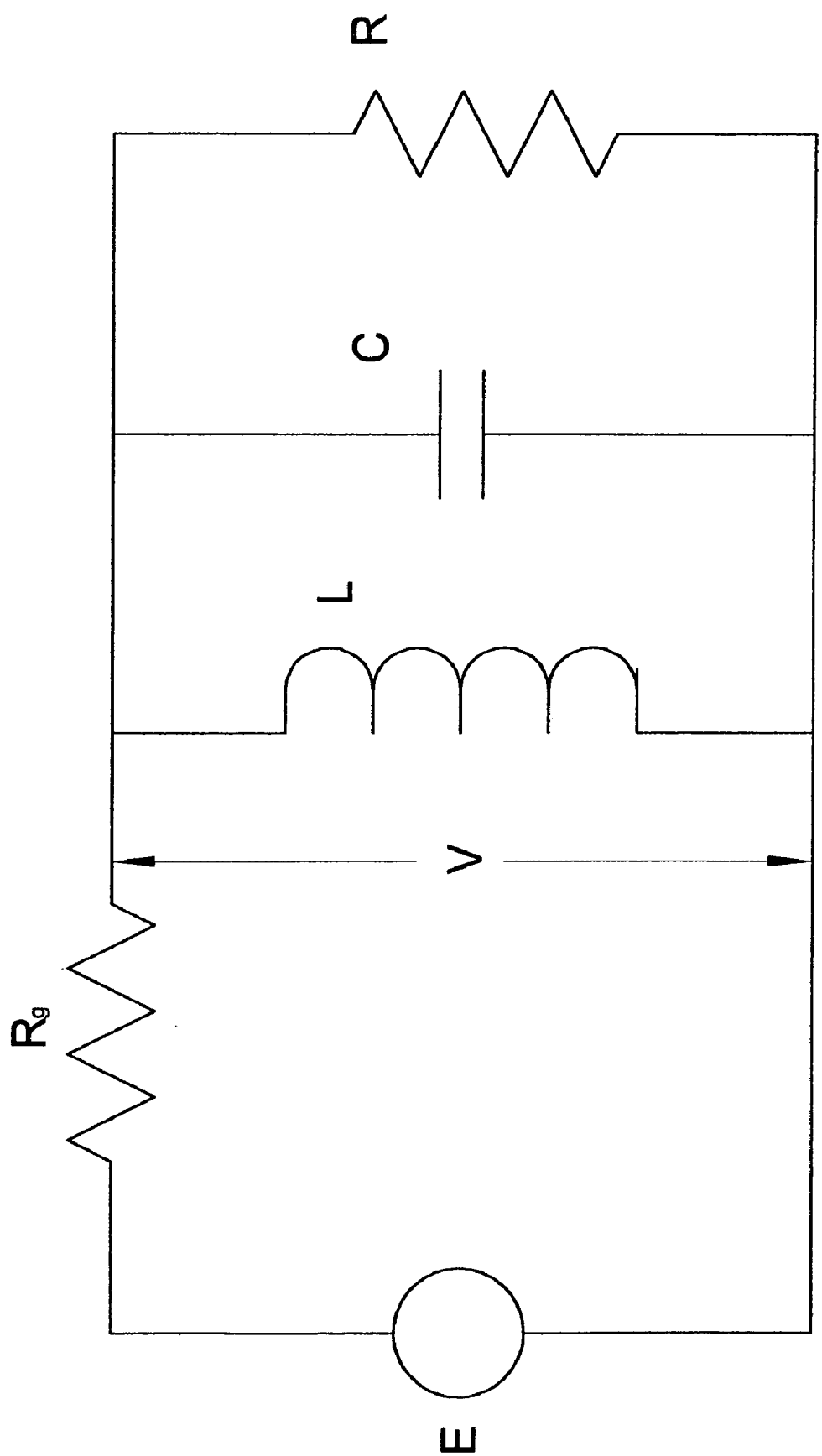
FIG. 11 is a schematic diagram for a generator with EMF, E, and resistance, $R_g$, connected to a parallel RLC network.
Figure 12:
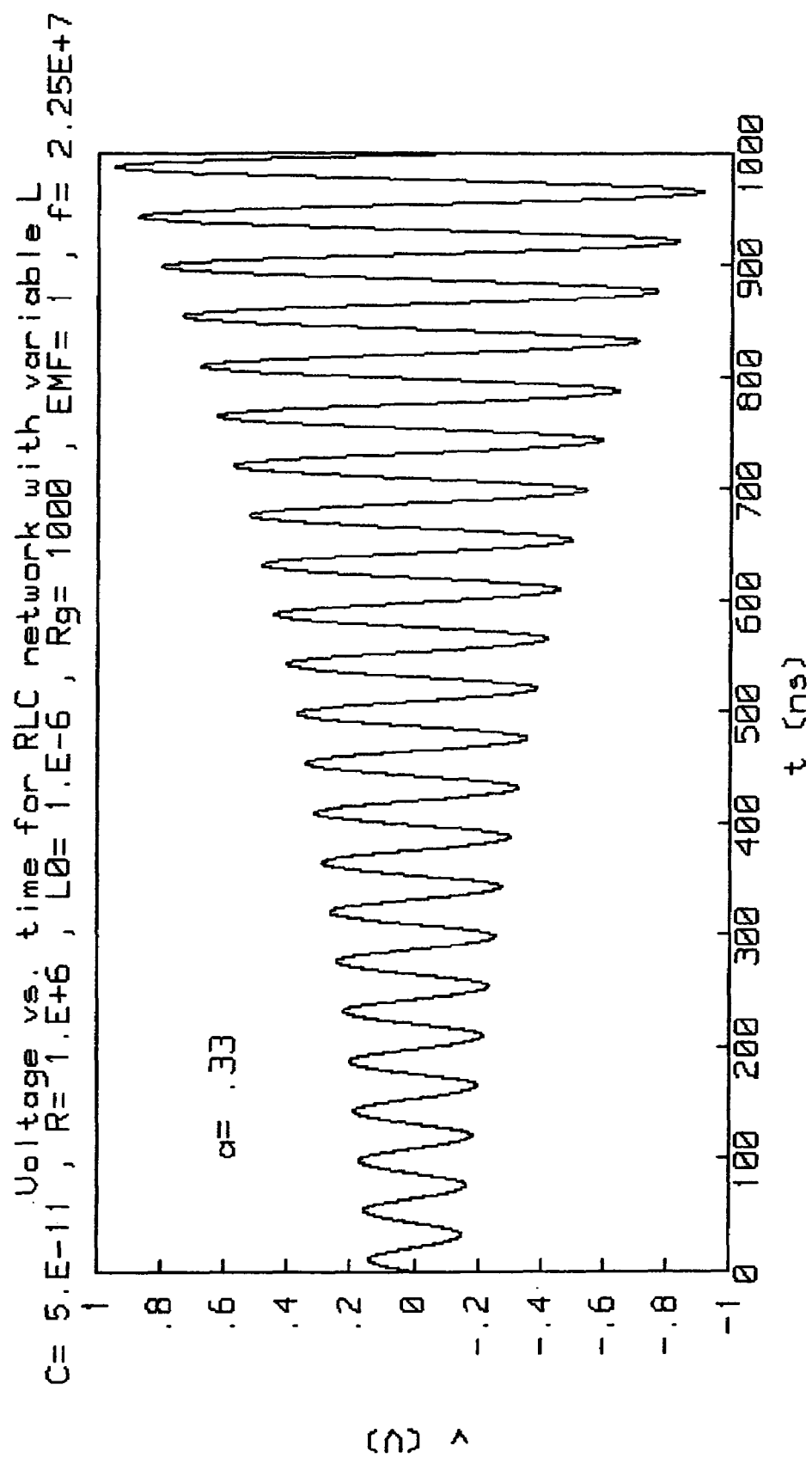
FIG. 12 shows voltage across a parallel network as a function of time for parametric amplification due to variable inductance for E=1 V, $R_g$=1 kΩ, a=0.33, $C_0$=50 pF, $L_0$=1 µH, $f_0$=22.5 MHz, and R=1 MΩ.

An alternative embodiment is a parallel RLC network illustrated in FIG. 11, where the inductance is varied. An AC generator with EMF, E, and resistance, $R_g$, represented by the resistor, is connected to the parallel network consisting of an inductor with inductance, L, a capacitor with capacitance, C, and a resistor with resistance, R. The circuit equation for the voltage, v, across the parallel network was solved numerically for $L=L_0[1+a\sin(\omega_p t+\phi)]$. An example of parametric amplification at $\omega=\omega_p/2$ is shown in FIG. 12 for E=1 V, $R_g=50\Omega$, a=0.33, R=1 M$\Omega$, $L_0=1$ µH, and C=0.5 pF, f=22.5 MHz, and a=0.33.

Figure 13:
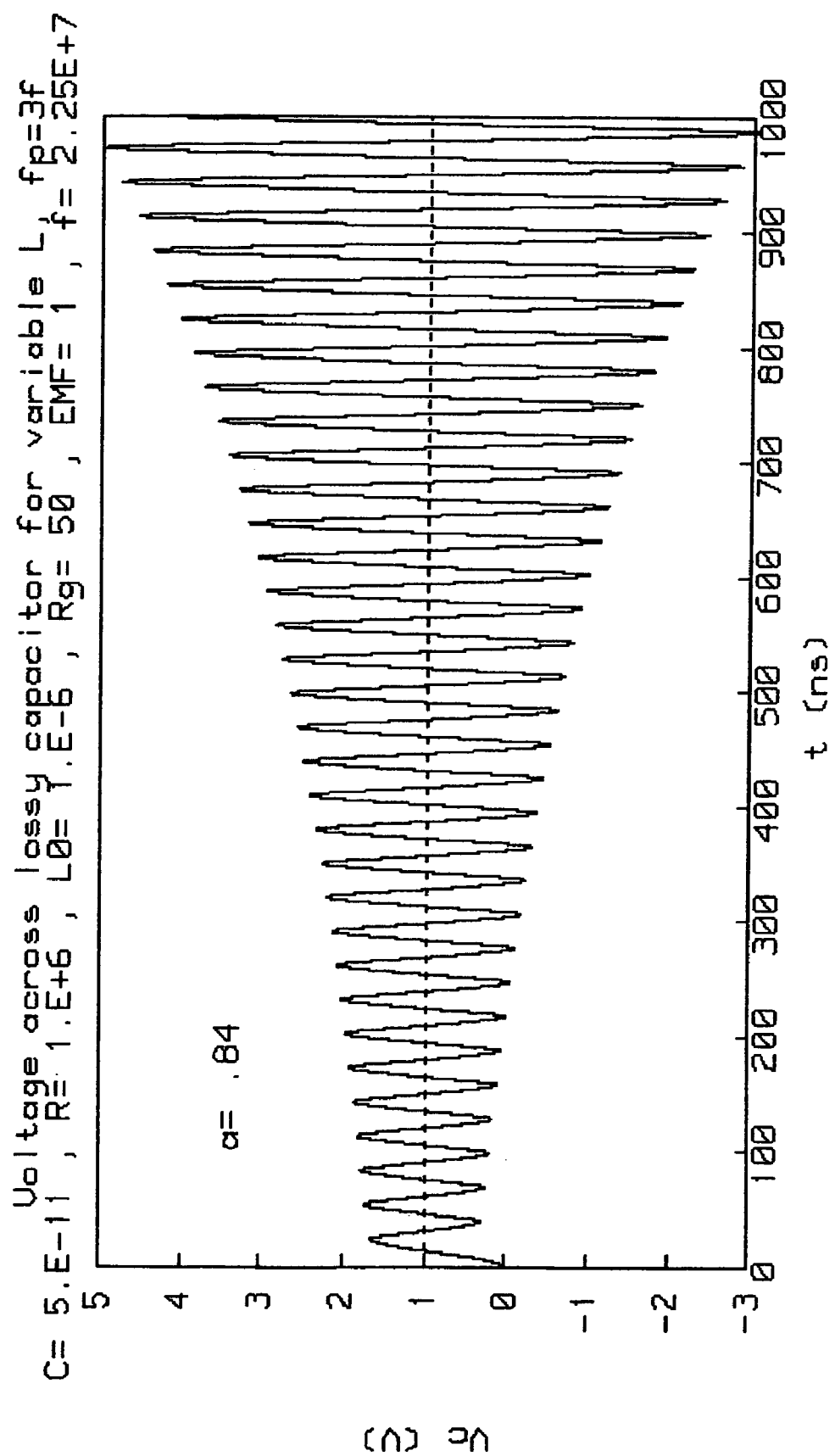
FIG. 13 shows voltage across a lossy capacitor for parametric amplification due to variable inductance for E=1 V, $R_g$=50Ω, a=0.84, $C_0$=50 pF, $L_0$=1 µH, $f_0$=22.5 MHz, and R=1 MΩ.

Yet another embodiment is provided by an AC generator with EMF, E, and resistance, $R_g$, connected in series with an inductance, L, and a lossy capacitor with capacitance, C, and parallel resistance, R. The circuit equation for the voltage, $v_c$, across the lossy capacitor was solved numerically for $L=L_0[1+a\sin(\omega_p t+\phi)]$. An example of parametric amplification at $\omega=\omega_p/3$ is shown in FIG. 13 for E=1 V, $R_g=50\Omega$, R=1 M$\Omega$, $L_0=1$ µH, C=0.5 pF, f=22.5 MHz, and a=0.84.

In accordance with the present invention, networks using variable inductance can be adapted to sense environmental characteristics. Coupling to the environment could occur through the magnetic permeability, µ, of the inductor. For example, if the inductor core material is a rare-earth magnet, such as an Nd—Fe—B alloy, then its magnetization is affected by temperature, chemically-aggressive media such as acids, and harmful gases such as hydrogen. Whereas these magnets often have protective coatings to preserve the magnetization, the coatings could be modified so that exposure to an aggressor would cause a change in the inductance, which would in turn modify the exponential growth of the parametric amplification. For example, a sensitive hydrogen detector could be designed based on parametric amplification in a variable-inductance RLC network.

In accordance with a further embodiment of the present invention, electromagnetic waveguides using variable parameters such as transverse dimensions can be adapted to sense environmental characteristics. For example, the capacitance of a transverse-electromagnetic transmission line may be varied by changing the spacing between the conductors guiding the wave. Access to the dielectric by substances in the environment may occur through a conducting wire mesh serving as one electrode. For example, in the case of RG-58 coaxial cable, a change in capacitance of the order of 2% at a signal frequency of 100 MHz would lead to exponential growth of the sensor signal.

Whereas particular embodiments of this invention have been described above for purposes of illustration, it will be evident to those skilled in the art that numerous variations of the details of the present invention may be made without departing from the invention as defined in the appended claims.

The invention claimed is:

1. A parametric amplification system comprising:
   a dither transducer;
   a pump transducer;
   an elastic rod connected between the dither and pump transducers; and means for measuring motion of the rod.

2. The parametric amplification system of claim 1, wherein the system comprises an amplifier which exhibits exponential temporal growth when exposed to an environmental characteristic.

3. An environmental sensor including a parametric amplifier which exhibits exponential temporal growth when exposed to an environmental characteristic.

4. The environmental sensor of claim 3, wherein the parametric amplifier comprises:
   a dither transducer;
   a pump transducer;
   an elastic rod connected between the dither and pump transducers; and
   means for measuring motion of the rod.

5. The environmental sensor of claim 4, wherein the elastic rod comprises a material that is affected by changes in the environmental characteristic.

6. The environmental sensor of claim 3, wherein the environmental characteristic is a substance present in the environment.

7. The environmental sensor of claim 3, wherein the environmental characteristic is electromagnetic radiation.

8. A method of detecting an environmental characteristic comprising:

exposing a sensor to an environment; and monitoring exponential temporal growth of a signal generated by the sensor upon exposure to the environmental characteristic.

9. The method of claim 8, wherein the sensor includes a parametric amplifier.

10. The method of claim 9, wherein the parametric amplifier comprises:

a dither transducer;

a pump transducer;

an elastic rod connected between the dither and pump transducers; and means for measuring motion of the rod.

11. The method of claim 8, wherein the environmental characteristic is a substance present in the environment.

12. The method of claim 8, wherein the environmental characteristic is electromagnetic radiation.

13. The parametric amplification system of claim 2, wherein the environmental characteristic is a substance in the environment.

14. The parametric amplification system of claim 2, wherein the environmental characteristic is temperature.

15. The parametric amplification system of claim 2, wherein the environmental characteristic is electromagnetic radiation.

16. The parametric amplification system of claim 3, wherein the environmental characteristic is temperature.

17. The method of claim 8, wherein the environmental characteristic is temperature.

* * * * *